(12) United States Patent
Lin et al.

(10) Patent No.: US 9,825,009 B2
(45) Date of Patent: Nov. 21, 2017

(54) INTERCONNECT SUBSTRATE HAVING CAVITY FOR STACKABLE SEMICONDUCTOR ASSEMBLY, MANUFACTURING METHOD THEREOF AND VERTICALLY STACKED SEMICONDUCTOR ASSEMBLY USING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

(*) Notice: Subject to any disclaimer, the term of this patent is extended or adjusted under 35 U.S.C. 154(b) by 0 days.

(21) Appl. No.: 15/247,443

(22) Filed: Aug. 25, 2016

(65) Prior Publication Data
US 2017/0069602 A1 Mar. 9, 2017

Related U.S. Application Data

(60) Provisional application No. 62/214,187, filed on Sep. 3, 2015.

(51) Int. Cl.
*H01L 21/4763* (2006.01)
*H01L 25/065* (2006.01)
(Continued)

(52) U.S. Cl.
CPC ........ *H01L 25/0657* (2013.01); *H01L 21/486* (2013.01); *H01L 23/16* (2013.01); *H01L 23/49827* (2013.01); *H01L 23/49838* (2013.01); *H01L 23/5389* (2013.01); *H01L 23/3121* (2013.01); *H01L 24/13* (2013.01); *H01L 24/16* (2013.01); *H01L 24/32* (2013.01); *H01L 24/73* (2013.01); *H01L 24/81* (2013.01);
(Continued)

(58) Field of Classification Search
CPC ............. H01L 25/0657; H01L 23/16; H01L 23/49827; H01L 23/5398; H01L 23/49838; H01L 21/486; H01L 23/3121
See application file for complete search history.

(56) References Cited

U.S. PATENT DOCUMENTS 7,894,203 B2   2/2011 Kariya et al.
7,989,950 B2   8/2011 Park et al.
(Continued)

*Primary Examiner* — A. Sefer
(74) *Attorney, Agent, or Firm* — Pai Patent & Trademark Law Firm; Chao-Chang David Pai

(57) ABSTRACT

An interconnect substrate having vertical connection channels around a cavity is characterized in that contact pads are exposed from the cavity and the vertical connection channels are made of a combination of metal posts and metallized vias. The cavity includes a recess in a core layer and an aperture in a stiffener. The metal posts, disposed over the top surface of the core layer, are sealed in the stiffener and are electrically connected to a buildup circuitry adjacent to the bottom surface of the core layer. The minimal height of the metal posts needed for the vertical connection can be reduced by the amount equal to the depth of the recess. The buildup circuitry is electrically connected to the metal posts through the metallized vias and provides the contact pads exposed from the cavity for device connection.

3 Claims, 16 Drawing Sheets

(51) Int. Cl.
    *H01L 23/498*     (2006.01)
    *H01L 21/48*     (2006.01)
    *H01L 23/538*     (2006.01)
    *H01L 23/16*     (2006.01)
    *H01L 23/31*     (2006.01)
    *H01L 23/00*     (2006.01)
    *H01L 25/10*     (2006.01)
    *H01L 25/00*     (2006.01)

(52) U.S. Cl.
    CPC ............ *H01L 24/92* (2013.01); *H01L 25/105* (2013.01); *H01L 25/50* (2013.01); *H01L 2224/131* (2013.01); *H01L 2224/13144* (2013.01); *H01L 2224/13147* (2013.01); *H01L 2224/16227* (2013.01); *H01L 2224/16235* (2013.01); *H01L 2224/16237* (2013.01); *H01L 2224/32225* (2013.01); *H01L 2224/73204* (2013.01); *H01L 2224/81203* (2013.01); *H01L 2224/81207* (2013.01); *H01L 2224/81815* (2013.01); *H01L 2224/92125* (2013.01); *H01L 2225/06517* (2013.01); *H01L 2225/06548* (2013.01); *H01L 2225/06572* (2013.01); *H01L 2225/1023* (2013.01); *H01L 2225/1058* (2013.01); *H01L 2924/15153* (2013.01); *H01L 2924/15313* (2013.01); *H01L 2924/18161* (2013.01); *H01L 2924/3511* (2013.01)

(56) References Cited

U.S. PATENT DOCUMENTS

| | | |
|---|---|---|
| 2013/0032388 A1 | 2/2013 | Lin et al. |
| 2013/0337648 A1* | 12/2013 | Lin .................. H01L 21/486 438/675 |
| 2014/0048319 A1* | 2/2014 | Pan .................. H05K 1/0216 174/258 |
| 2017/0034923 A1* | 2/2017 | Lin .................. H05K 3/4038 |

\* cited by examiner

INTERCONNECT SUBSTRATE HAVING CAVITY FOR STACKABLE SEMICONDUCTOR ASSEMBLY, MANUFACTURING METHOD THEREOF AND VERTICALLY STACKED SEMICONDUCTOR ASSEMBLY USING THE SAME

CROSS REFERENCE TO RELATED APPLICATIONS

This application claims the benefit of filing date of U.S. Provisional Application Ser. No. 62/214,187 filed Sep. 3, 2015. The entirety of said Provisional Application is incorporated herein by reference.

FIELD OF THE INVENTION

The present invention relates to an interconnect substrate and, more particularly, to an interconnect substrate having a cavity surrounded by an array of vertical connection channels which are made of a combination of metal posts and metallized vias, and a method of making the same and a vertically stacked semiconductor assembly using the same.

DESCRIPTION OF RELATED ART

Market trends of multimedia devices demand for faster and slimmer designs. One of the approaches is to assemble multiple devices on a wiring board with stacking configuration so that the electrical performance can be improved and the form-factor can be further minimized. U.S. Pat. No. 7,894,203 discloses a wiring board having a cavity and plated metal post around the cavity for such kind of purpose. However, as it is extremely difficult to deposit metal posts with high aspect ratio opening (tall and narrow) by plating, voids trapped in the metal posts or poor binding strength may lead to I/O disconnection, device failure and low manufacturing yield. Alternatively, as described in U.S. Pat. No. 7,989,950, vertical connection channel is formed by attaching a solder ball on a substrate and sealed by encapsulation and thus form a cavity. However, as solder ball is typically in a round shape after it is reflowed, a large solder ball that may meet height requirement will cause undesirable increase in board size as well. As such, using solder ball for vertical connection does not meet stringent requirements for portables.

For the reasons stated above, and for other reasons stated below, an urgent need exists to develop a new wiring board having cavity that can address ultra-high packaging density, high signal integrity, low profile and high manufacturing yield issues.

SUMMARY OF THE INVENTION

A primary objective of the present invention is to provide an interconnect substrate having a cavity and a plurality of vertical connection channels around the cavity so as to realize ultra-thin vertically stacked semiconductor assembly.

Another objective of the present invention is to provide an interconnect substrate with a cavity that is formed by a combination of a recess in a core layer and an aperture in a stiffener so that an adequate depth of the cavity can be achieved for accommodating a semiconductor device assembled therein.

Yet another objective of the present invention is to provide an interconnect substrate having an array of vertical connection channels around a cavity in which the vertical connection channels are made of a combination of metal posts and metallized vias. As the height of the metal post and the depth of the via combined together can match or exceed the depth of the cavity, the interconnect substrate can provide vertical interconnections for stacking devices and enjoy high manufacturing yield and low cost.

In accordance with the foregoing and other objectives, the present invention provides an interconnect substrate that includes a core layer, a buildup circuitry, a stiffener, an array of metal posts, and a cavity. The core layer has a first surface and an opposite second surface. The buildup circuitry is disposed over the first surface of the core layer and has an exterior surface facing away from the first surface of the core layer. The stiffener is disposed over the second surface of the core layer and has an exterior surface facing away from the second surface of the core layer. The metal posts are sealed in the stiffener and exposed from the exterior surface of the stiffener and electrically connected to the buildup circuitry through metallized vias in the core layer. The cavity includes an aperture in the stiffener and a recess in the core layer and has a bottom surface facing away from the exterior surface of the buildup circuitry and sidewalls extending from the bottom surface to the exterior surface of the stiffener. The aperture and the recess are aligned with each other. The buildup circuitry has an array of contact pads are exposed from the bottom surface of the cavity.

In another aspect, the present invention provides a vertically stacked semiconductor assembly that includes the aforementioned interconnect substrate, a first semiconductor device and a second semiconductor device. The first semiconductor device is disposed in the cavity and electrically coupled to the interconnect substrate through the contact pads exposed from the bottom surface of the cavity. The second semiconductor device is disposed over the exterior surface of the buildup circuitry or the exterior surface of the stiffener and electrically coupled to the interconnect substrate through the buildup circuitry or the metal posts.

In yet another aspect, the present invention provides a method of making an interconnect substrate, comprising steps of: forming a protruded metal platform on a surface of a metal carrier; forming a core layer covering the protruded metal platform and the remaining surface of the metal carrier, wherein the core layer has a first surface facing away from the metal carrier and an opposite second surface adjacent to the metal carrier; forming an array of metal posts and a metal slug by removing a portion of the metal carrier, wherein the metal slug is aligned with the protruded metal platform; forming a buildup circuitry from the first surface of the core layer, the buildup circuitry having an exterior surface facing away from the first surface of the core layer; forming a stiffener that covers the second surface of the core layer and sidewalls of the metal slug and the metal posts, the stiffener having an exterior surface facing away from the second surface of the core layer; and forming a cavity by removing the metal slug and the protruded metal platform, the cavity including an aperture in the stiffener and a recess in the core layer and having a bottom surface and sidewalls that extend from the bottom surface to the exterior surface of the stiffener.

Unless specifically indicated or using the term "then" between steps, or steps necessarily occurring in a certain order, the sequence of the above-mentioned steps is not limited to that set forth above and may be changed or reordered according to desired design.

The methods of making an interconnect substrate according to the present invention have numerous advantages. For instance, forming the recess in the core layer is particularly advantageous as the minimal height of the metal posts needed for the vertical connection can be reduced by an amount equal to the depth of the recess. As the first semiconductor device can be disposed at the recess in the core layer and extend to the aperture in the stiffener, no extra grinding or lapping is needed for the first semiconductor device in order to achieve ultra-thin vertically stacked semiconductor assembly feature. Forming the metal posts over the core layer can offer vertical routing to proceed with package-on-package interconnection procedure for the second semiconductor device disposed over the stiffener and electrically coupled to the first semiconductor device in the cavity through the buildup circuitry. Further, the second semiconductor device also can be mounted over the exterior surface of the buildup circuitry, so that the buildup circuitry over the first surface of the core layer can offer the shortest interconnection distance between the first and second semiconductor devices.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-14 are schematic views showing a method of making an interconnect substrate that includes a core layer, a buildup circuitry, a stiffener, an array of metal posts, and a cavity in accordance with the first embodiment of the present invention.

Figure 1:
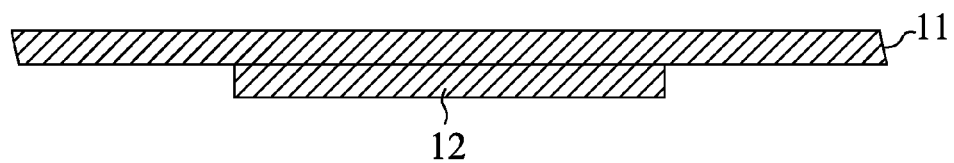
FIGS. 1 and 2 are cross-sectional and bottom perspective views, respectively, of a protruded metal platform formed on a metal carrier in accordance with the first embodiment of the present invention.
Figure 2:
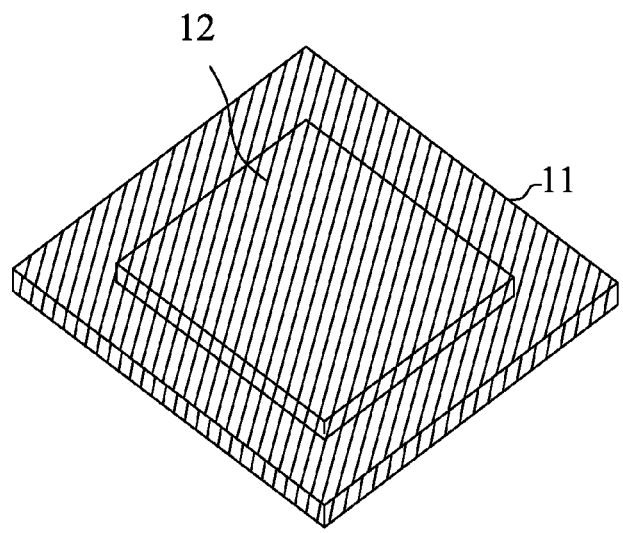

FIGS. 1 and 2 are cross-sectional and bottom perspective views, respectively, of the structure with a protruded metal platform 12 formed on a metal carrier 11. The metal carrier 11 and the protruded metal platform 12 typically are made of copper, aluminum, nickel, stainless steel, or other metals or alloys. The material of the protruded metal platform 12 may be the same as or different from that of the metal carrier 11. The thickness of the metal carrier 11 can range from 0.05 to 0.5 mm (preferably from 0.1 to 0.2 mm), whereas the thickness of the protruded metal platform 12 can range from 10 to 100 microns. In this embodiment, the metal carrier 11 is made of copper and has a thickness of 0.15 mm, whereas the protruded metal platform 12 is made of copper and has a thickness of 30 microns. The protruded metal platform 12 can be formed on a surface of the metal carrier 11 by pattern deposition, such as electroplating, electroless plating, evaporating, sputtering or their combinations, or by etching or mechanical carving.

Figure 3:
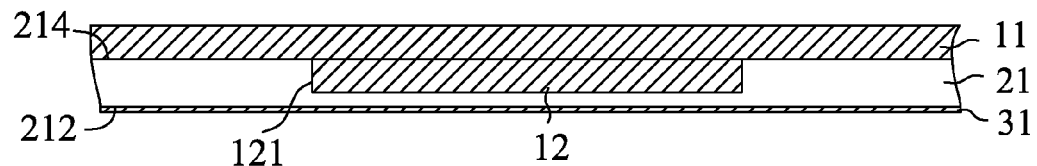
FIG. 3 is a cross-sectional view showing that the structure of FIG. 1 is provided with a core layer and a metal layer in accordance with the first embodiment of the present invention.

FIG. 3 is a cross-sectional view of the structure with a core layer 21 and a metal layer 31 on the metal carrier 11 and the protruded metal platform 12. The core layer 21 and the metal layer 31 are deposited typically by lamination or coating. The core layer 21 can be made of epoxy resin, glass-epoxy, polyimide, or the like, and the metal layer 31 typically is a copper layer. The core layer 21 contacts and covers and extends laterally on the protruded metal platform 12 and the remaining surface of the metal carrier 11 from below, and surrounds and conformally coats side walls 121 of the protruded metal platform 12 in the lateral directions. As a result, the core layer 21 has a first surface 212 facing away from the metal carrier 11 and the protruded metal platform 12, and an opposite second surface 214 adjacent to and in contact with the metal carrier 11. The metal layer 31 contacts and covers the first surface 212 of the core layer 21 from below.

Figure 4:
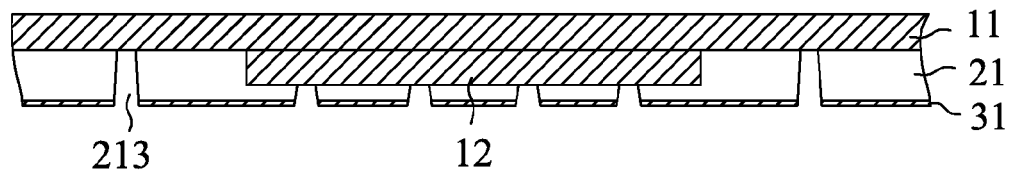
FIGS. 4 and 5 are cross-sectional and top perspective views, respectively, showing that the structure of FIG. 3 is provided with via openings in accordance with the first embodiment of the present invention.
Figure 5:
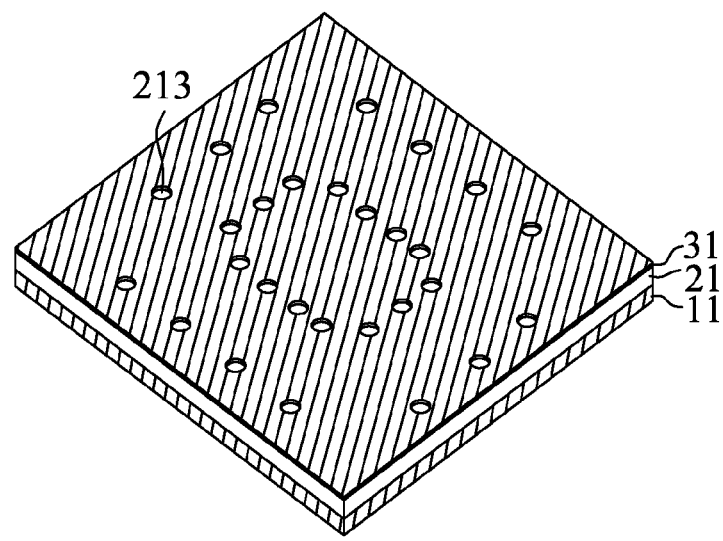

FIGS. 4 and 5 are cross-sectional and bottom perspective views, respectively, of the structure provided with via openings 213 to expose selected portions of the metal carrier 11 and the protruded metal platform 12 from below. The via openings 213 are formed by numerous techniques including laser drilling, plasma etching and photolithography, and typically have a diameter of 50 microns. Laser drilling can be enhanced by a pulsed laser. Alternatively, a scanning laser beam with a metal mask can be used. The via openings 213 extend through the core layer 21 and the metal layer 31 and are aligned with selected portions of the metal carrier 11 and the protruded metal platform 12.

Figure 6:
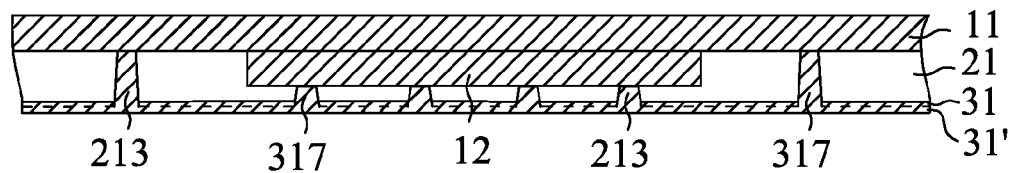
FIG. 6 is a cross-sectional view showing that the structure of FIG. 4 is provided with a plated layer in accordance with the first embodiment of the present invention.

FIG. 6 is a cross-sectional view of the structure with a plated layer 31' on the metal layer 31 and in the via openings 213. The plated layer 31' extends from the metal carrier 11 and the protruded metal platform 12 in the downward direction, fill up the via openings 213 to form metallized vias 317 in direct contact with the metal carrier 11 and the protruded metal platform 12, and extend laterally on the core layer 21.

The plated layer 31' can be deposited as a single layer or multiple layers by any of numerous techniques, such as electroplating, electroless plating, evaporating, sputtering, or their combinations. For instance, they can be deposited by first dipping the structure in an activator solution to render the core layer 21 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer.

Figure 7:
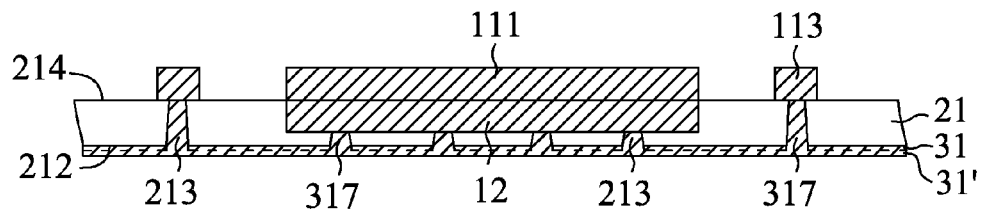
FIGS. 7 and 8 are cross-sectional and top perspective views, respectively, showing that a selected portion of the metal carrier is removed from the structure of FIG. 6 in accordance with the first embodiment of the present invention.
Figure 8:
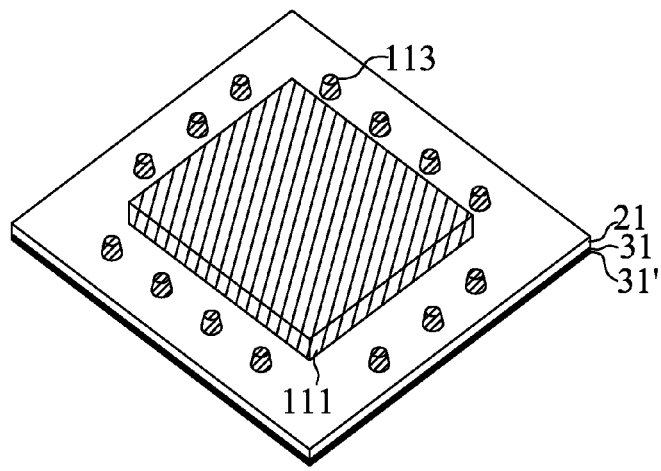

FIGS. 7 and 8 are cross-sectional and top perspective views, respectively, of the structure with a metal slug 111 and an array of metal posts 113 formed by removing a selected portion of the metal carrier 11 using, for example, photolithography and wet etching The metal slug 111 is aligned with and covers the protruded metal platform 12 from above, and the metal posts 113 are located on the second surface 214 of the core layer 21 and electrically connected to the metallized vias 317.

Figure 9:
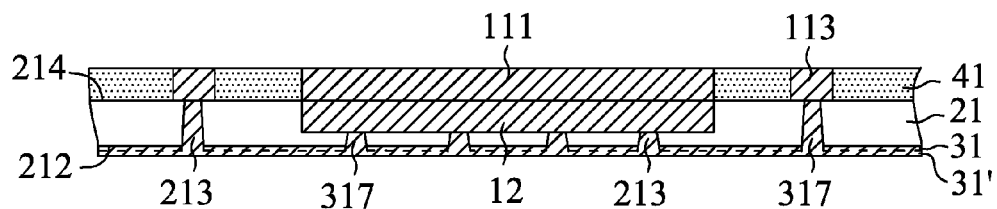
FIGS. 9 and 10 are cross-sectional and top perspective views, respectively, showing that the structure of FIGS. 7 and 8 is provided with a stiffener in accordance with the first embodiment of the present invention.
Figure 10:
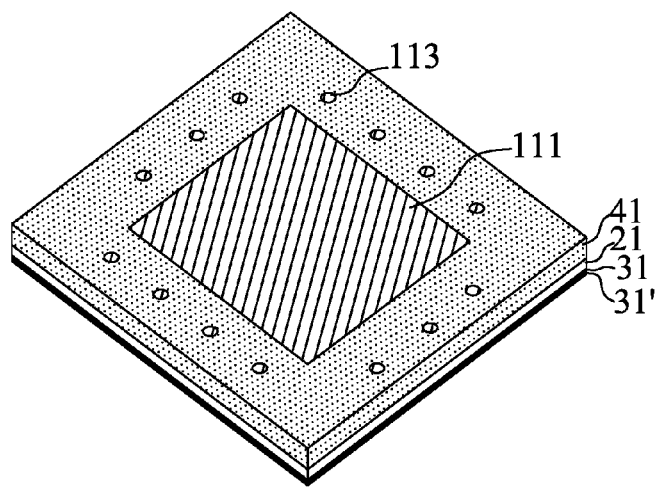

FIGS. 9 and 10 are cross-sectional and top perspective views, respectively, of the structure with a stiffener 41 on the exposed second surface 214 of the core layer 21. The stiffener 41 is formed typically by printing or molding of resin sealant to cover the second surface 214 of the core layer 21 from above and to surround and conformally coat and cover sidewalls of the metal slug 111 and the metal posts 113 in the lateral directions. In this illustration, the stiffener 41 has a thickness equal to that of the metal slug 111 and the metal posts 113.

Figure 11:
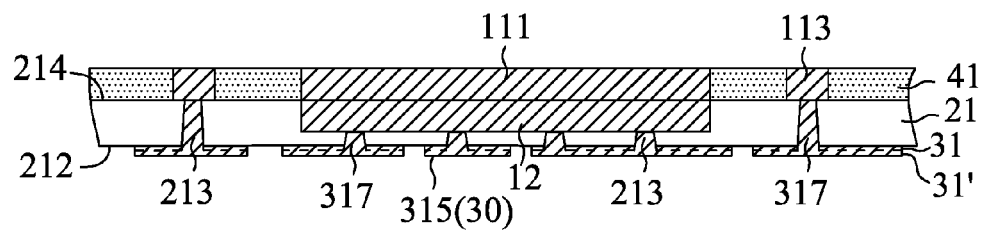
FIGS. 11 and 12 are cross-sectional and bottom perspective views, respectively, showing that the structure of FIGS. 9 and 10 is provided with conductive traces in accordance with the first embodiment of the present invention.
Figure 12:
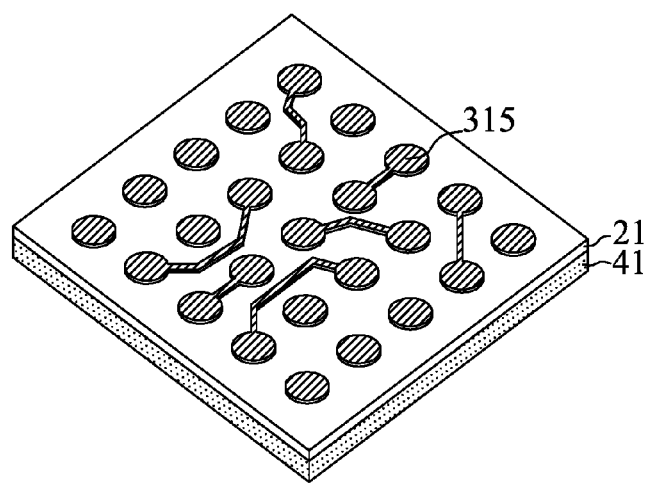

FIGS. 11 and 12 are cross-sectional and bottom perspective views, respectively, of the structure with conductive traces 315 on the core layer 21 by metal patterning process. The metal layer 31 and the plated layer 31' can be patterned to form the conductive traces 315 by any of numerous techniques, such as wet etching, electro-chemical etching, laser-assist etching, or their combinations, with an etch mask (not shown) thereon that defines the conductive traces 315. The conductive traces 315 include the metallized vias 317 in the core layer 21 and extend laterally on the first surface 212 of the core layer 21. As a result, the conductive traces 315 can provide horizontal signal routing in both the X and Y directions and vertical routing through the via openings 213.

At this stage, a buildup circuitry 30 is accomplished and includes conductive traces 315 that are electrically connected to the metal posts 113 through the metallized vias 317 in the core layer 21.

Figure 13:
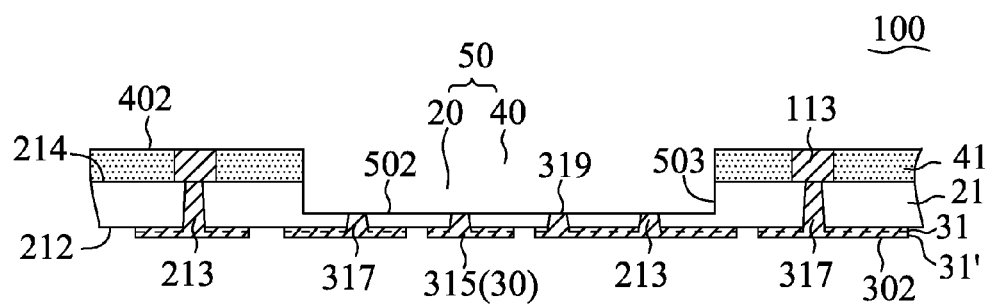
FIGS. 13 and 14 are cross-sectional and top perspective views, respectively, showing that the structure of FIGS. 11 and 12 is provided with a cavity to finish the fabrication of an interconnect substrate in accordance with the first embodiment of the present invention.
Figure 14:
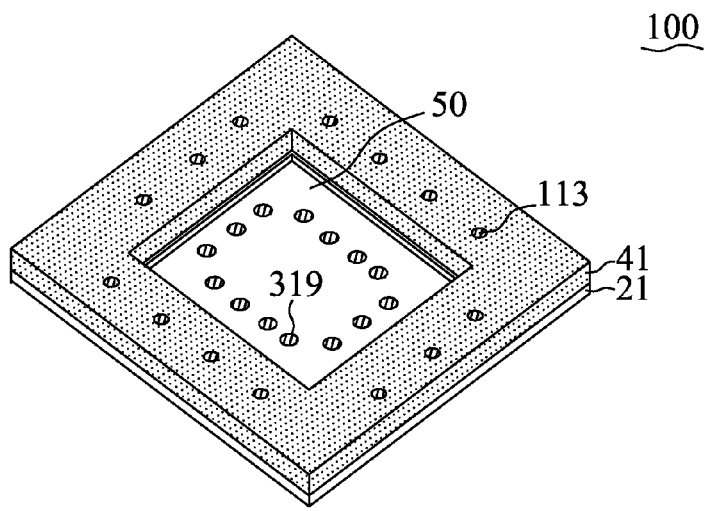

FIGS. 13 and 14 are cross-sectional and top perspective views, respectively, of the structure after removal of the metal slug 111 and the protruded metal platform 12. The metal slug 111 and the protruded metal platform 12 can be removed by numerous techniques, such as wet chemical etching, electro-chemical etching or laser. As a result, a cavity 50 is formed and consists of a recess 20 in the core layer 21 and an aperture 40 in the stiffener 41. The aperture 40 is aligned with the recess 20 so as to expose the metallized vias 317 at the recess 20.

Accordingly, as shown in FIGS. 13 and 14, an interconnect substrate 100 is accomplished and includes an array of metal posts 113, a core layer 21, a buildup circuitry 30, a stiffener 41 and a cavity 50. The buildup circuitry 30 is disposed over the first surface 212 of the core layer 21 and has an exterior surface 302 facing away from the first surface 212 of the core layer 21 and includes metallized vias 317 in the core layer 21. Some of the metallized vias 317 are aligned with and electrically connected to the metal posts 113, whereas others are aligned with the cavity 50 and have a surface exposed from the cavity 50 to serve as contact pads 319 for device connection. The stiffener 41 is disposed over the second surface 214 of the core layer 21 and has an exterior surface 402 facing away from the second surface 214 of the core layer 21. The metal posts 113 are sealed in the stiffener 41 and exposed from the exterior surface 402 of the stiffener 41 and electrically connected to the buildup circuitry 30 through the metallized vias 317 in the core layer 21. The cavity 50 has a bottom surface 502 spaced from the exterior surface 302 of the buildup circuitry 30 and sidewalls 503 extend from the bottom surface 502 to the exterior surface 402 of the stiffener 41. In this illustration, the bottom surface 502 of the cavity 50 is substantially coplanar with the exposed surface of the metallized vias 317 at the recess 20. However, in some cases, the exposed surface of the metallized vias 317 at the recess 20 would be lower than the bottom surface 502 of the cavity 50 because the metallized vias 317 may be slightly etched in the step of removing the protruded metal platform 12. In any case, the contact pads 319 of the buildup circuitry 30 are exposed from the bottom surface 502 of the cavity 50.

Figure 15:
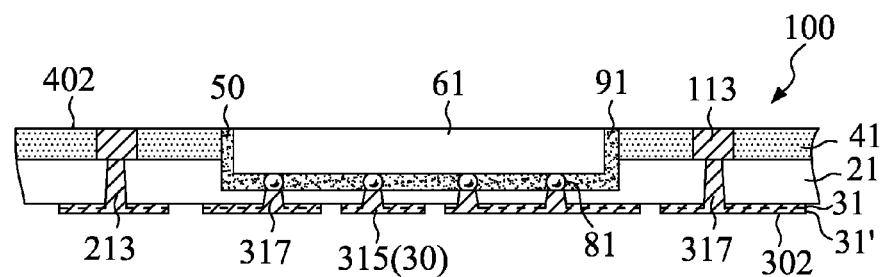
FIG. 15 is a cross-sectional view of a semiconductor assembly with a first semiconductor device electrically coupled to the interconnect substrate of FIG. 13 in accordance with the first embodiment of the present invention.

FIG. 15 is a cross-sectional view of a semiconductor assembly with a first semiconductor device 61 electrically coupled to the interconnect substrate 100 of FIG. 13. The first semiconductor device 61 is disposed in the cavity 50 of the interconnect substrate 100 and electrically coupled to the contact pads 319 of the buildup circuitry 30 using bumps 81 by, for example, thermal compression, solder reflow or thermosonic bonding. The bumps 81 can be copper, solder or gold pillars or other conductive bumps. Optionally, a resin encapsulation element 91 may be further provided to cover and extend from the bottom surface 502 of the cavity 50 and fill the spaces unoccupied by the first semiconductor device 61.

Figure 16:
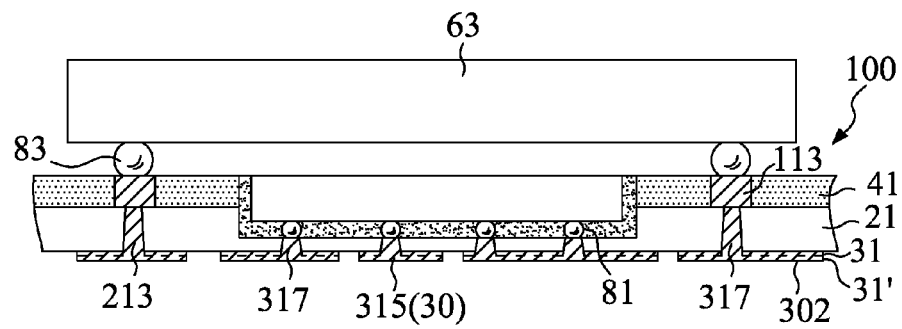
FIG. 16 is a cross-sectional view of a vertically stacked semiconductor assembly with a second semiconductor device electrically coupled to the semiconductor assembly of FIG. 15 in accordance with the first embodiment of the present invention.

FIG. 16 is a cross-sectional view of a vertically stacked semiconductor assembly with a second semiconductor device 63 mounted on the semiconductor assembly of FIG. 15. The second semiconductor device 63 is disposed over the exterior surface 402 of the stiffener 41 and electrically coupled to the interconnect substrate 100 via solder balls 83 in contact with the metal posts 113. As a result, a package-on-package assembly is accomplished, and the second semiconductor device 63 is electrically connected to the first semiconductor device 61 through the metal posts 113 and the buildup circuitry 30.

Figure 17:
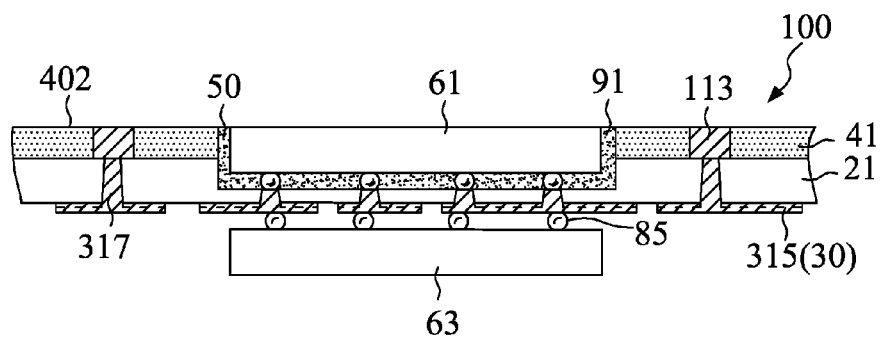
FIG. 17 is a cross-sectional view of another vertically stacked semiconductor assembly with a second semiconductor device electrically coupled to the semiconductor assembly of FIG. 15 in accordance with the first embodiment of the present invention.

FIG. 17 is a cross-sectional view of another vertically stacked semiconductor assembly with a second semiconductor device 63 mounted on the semiconductor assembly of FIG. 15. The second semiconductor device 63 is disposed over the exterior surface 302 of the buildup circuitry 30 and electrically coupled to the interconnect substrate 100 via bumps 85 in contact with the conductive traces 315 of the buildup circuitry 30. As a result, a face-to-face assembly is accomplished, and the second semiconductor device 63 is face-to-face electrically connected to the first semiconductor device 61 through the buildup circuitry 30 therebetween.

Embodiment 2

FIGS. 18-24 are schematic views showing a method of making an interconnect substrate with auxiliary metal pads in the core layer in accordance with the second embodiment of the present invention.

For purposes of brevity, any description in Embodiment 1 above is incorporated herein insofar as the same is applicable, and the same description need not be repeated.

Figure 18:
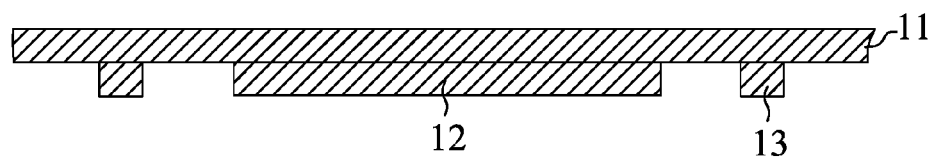
FIG. 18 is a cross-sectional view showing that a protruded metal platform and an array of auxiliary metal pads are formed on a metal carrier in accordance with the second embodiment of the present invention.

FIG. 18 is a cross-sectional view of the structure with a protruded metal platform 12 and an array of auxiliary metal pads 13 formed on a metal carrier 11. The protruded metal platform 12 and the auxiliary metal pads 13 extend from a surface of the metal carrier 11 in the downward direction and have the same thickness. The auxiliary metal pads 13 can be made of the same material as the protruded metal platform 12, and may be formed by pattern deposition, such as electroplating, electroless plating, evaporating, sputtering or their combinations, or by etching or mechanical carving.

Figure 19:
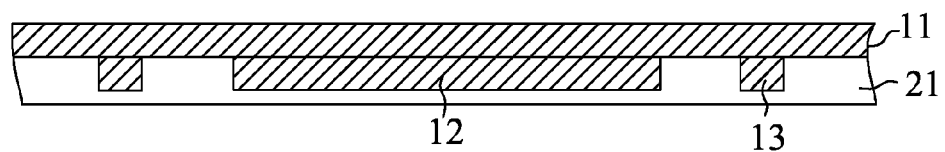
FIG. 19 is a cross-sectional view showing that the structure of FIG. 18 is provided with a core layer in accordance with the second embodiment of the present invention.

FIG. 19 is a cross-sectional view of the structure with a core layer 21 on the metal carrier 11, the protruded metal platform 12 and the auxiliary metal pads 13. The core layer 21 contacts and covers the metal carrier 11, the protruded metal platform 12 and the auxiliary metal pads 13 from below, and surrounds and conformally coats sidewalls of the protruded metal platform 12 and the auxiliary metal pads 13 in the lateral directions.

Figure 20:
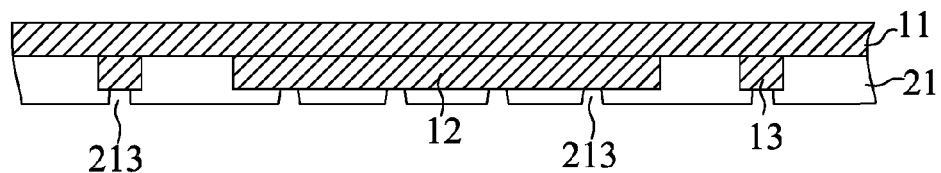
FIG. 20 is a cross-sectional view showing that the structure of FIG. 19 is provided with via openings in accordance with the second embodiment of the present invention.

FIG. 20 is a cross-sectional view of the structure provided with via openings 213 to expose selected portions of the protruded metal platform 12 and the auxiliary metal pads 13 from below. The via openings 213 extend through the core layer 21 and aligned with selected portions of the protruded metal platform 12 and the auxiliary metal pads 13.

Figure 21:
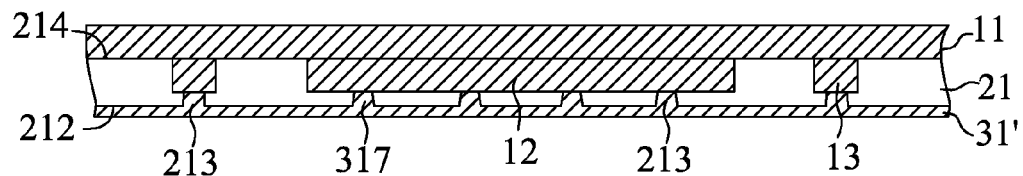
FIG. 21 is a cross-sectional view showing that the structure of FIG. 20 is provided with a plated layer in accordance with the second embodiment of the present invention.

FIG. 21 is a cross-sectional view of the structure with a plated layer 31' on the core layer 21 and in the via openings 213. The plated layer 31' extends from the protruded metal platform 12 and the auxiliary metal pads 13 in the downward direction, fill up the via openings 213 to form metallized vias 317 in direct contact with the protruded metal platform 12 and the auxiliary metal pads 13, and extend laterally on the first surface 212 of the core layer 21.

Figure 22:
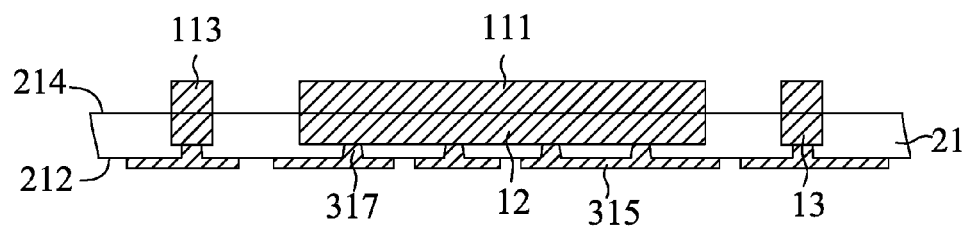
FIG. 22 is a cross-sectional view showing that the structure of FIG. 21 is formed with a metal slug, metal posts and conductive traces in accordance with the second embodiment of the present invention.

FIG. 22 is a cross-sectional view of the structure with a metal slug 111, an array of metal posts 113 and conductive traces 315 formed by removing selected portions of the metal carrier 11 and the plated layer 31'. The metal slug 111 is aligned with and covers the protruded metal platform 12 from above. The metal posts 113 are aligned with and electrically connected to the auxiliary metal pads 13. The diameter of the metal post 113 at its bottom surface may be the same as or different from that of the auxiliary metal pad 13 at its top surface. The conductive traces 315 include the metallized vias 317 in the core layer 21 and extend laterally on the first surface 212 of the core layer 21.

Figure 23:
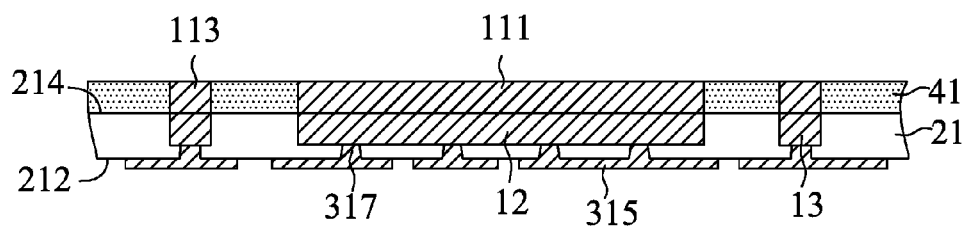
FIG. 23 is a cross-sectional view showing that the structure of FIG. 22 is provided with a stiffener in accordance with the second embodiment of the present invention.

FIG. 23 is a cross-sectional view of the structure with a stiffener 41 on the exposed second surface 214 of the core layer 21. The stiffener 41 covers the second surface 214 of the core layer 21 from above and surrounds and conformally coats and covers sidewalls of the metal slug 111 and the metal posts 113 in the lateral directions.

Figure 24:
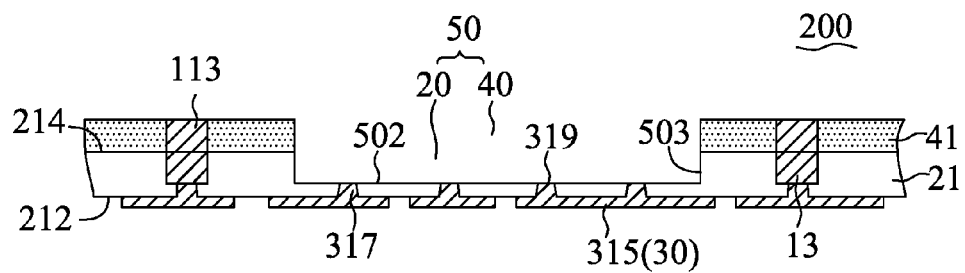
FIG. 24 is a cross-sectional view showing that the structure of FIG. 23 is provided with a cavity to finish the fabrication of an interconnect substrate in accordance with the second embodiment of the present invention.

FIG. 24 is a cross-sectional view of the structure after removal of the metal slug 111 and the protruded metal platform 12. As a result, a cavity 50 is formed and consists of a recess 20 in the core layer 21 and an aperture 40 in the stiffener 41. The recess 20 has a depth substantially equal to the thickness of the auxiliary metal pads 13, and the aperture 40 is aligned with the recess 20.

Accordingly, as shown in FIG. 24, an interconnect substrate 200 is accomplished and includes an array of metal posts 113, an array of auxiliary metal pads 13, a core layer 21, a buildup circuitry 30, a stiffener 41 and a cavity 50. The buildup circuitry 30 includes conductive traces 315 that are electrically connected to the auxiliary metal pads 13 and have selected portions exposed from the cavity 50 to serve as contact pads 319 for device connection and laterally extend on the first surface 212 of the core layer 21. The stiffener 41 is disposed on the second surface 214 of the core layer 21 and covers sidewalls of the metal posts 113. The auxiliary metal pads 13 are sealed in the core layer 21 and electrically connected to and disposed between the metal posts 113 and the metallized vias 317.

Figure 25:
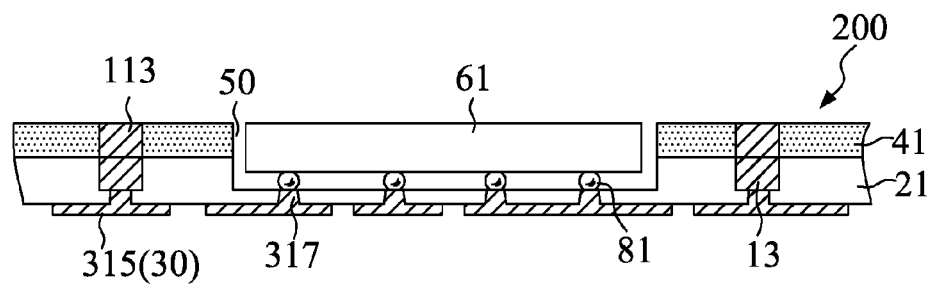
FIG. 25 is a cross-sectional view of a semiconductor assembly with a first semiconductor device electrically coupled to the interconnect substrate of FIG. 24 in accordance with the second embodiment of the present invention.

FIG. 25 is a cross-sectional view of a semiconductor assembly with a first semiconductor device 61 electrically coupled to the interconnect substrate 200 of FIG. 24. The first semiconductor device 61 is disposed in the cavity 50 of the interconnect substrate 200 and electrically coupled to the contact pads 319 of the buildup circuitry 30 via bumps 81.

Figure 26:
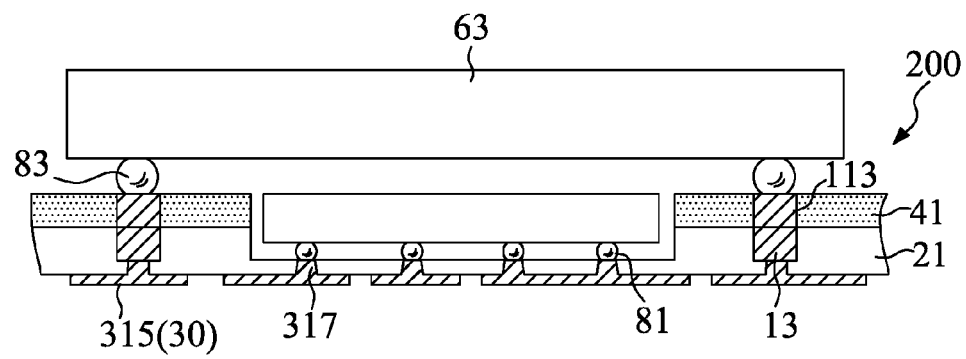
FIG. 26 is a cross-sectional view of a vertically stacked semiconductor assembly with a second semiconductor device electrically coupled to the semiconductor assembly of FIG. 25 in accordance with the second embodiment of the present invention.

FIG. 26 is a cross-sectional view of a vertically stacked semiconductor assembly with a second semiconductor device 63 electrically coupled to the semiconductor assembly of FIG. 25. The second semiconductor device 63 is mounted on the interconnect substrate 200 via solder balls 83 in contact with the metal posts 113 and electrically connected to the first semiconductor device 61 through the metal posts 113, the auxiliary metal pads 13 and the buildup circuitry 30.

Figure 27:
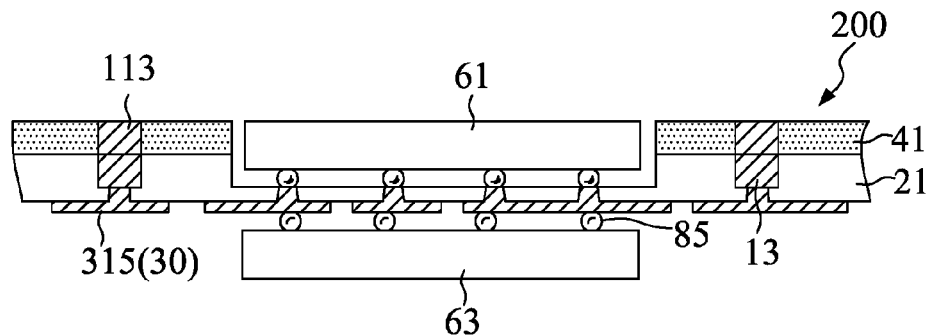
FIG. 27 is a cross-sectional view of another vertically stacked semiconductor assembly with a second semiconductor device electrically coupled to the semiconductor assembly of FIG. 25 in accordance with the second embodiment of the present invention.

FIG. 27 is a cross-sectional view of another vertically stacked semiconductor assembly with a second semiconductor device 63 electrically coupled to the semiconductor assembly of FIG. 25. The second semiconductor device 63 is face-to-face electrically connected to the first semiconductor device 61 through the buildup circuitry 30 therebetween.

Embodiment 3

FIGS. 28-34 are schematic views showing a method of making an interconnect substrate with routing traces exposed from the cavity in accordance with the third embodiment of the present invention.

For purposes of brevity, any description in aforementioned Embodiments above is incorporated herein insofar as the same is applicable, and the same description need not be repeated.

Figure 28:
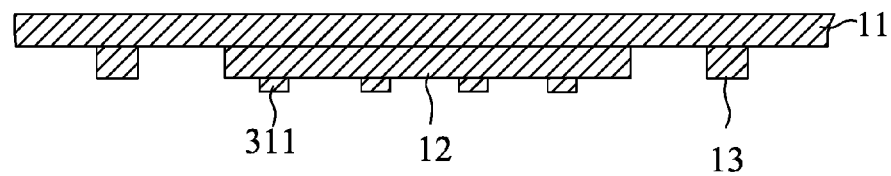
FIG. 28 is a cross-sectional view showing that the structure of FIG. 18 is provided with routing traces in accordance with the third embodiment of the present invention.

FIG. 28 is a cross-sectional view of the structure with routing traces 311 formed on the protruded metal platform 12 of FIG. 18. The routing traces 311 typically are made of copper and can be pattern deposited by numerous techniques, such as electroplating, electroless plating, evaporating, sputtering or their combinations, or be thin-film deposited followed by a metal patterning process.

Figure 29:
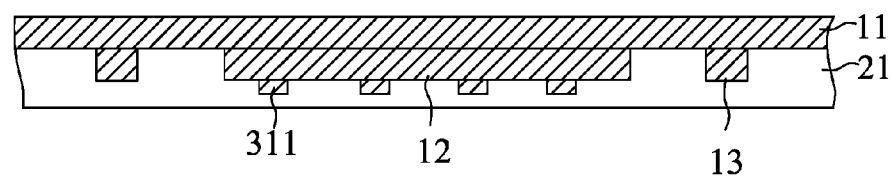
FIG. 29 is a cross-sectional view showing that the structure of FIG. 28 is provided with a core layer in accordance with the third embodiment of the present invention.

FIG. 29 is a cross-sectional view of the structure with a core layer 21 on the metal carrier 11, the protruded metal platform 12, the auxiliary metal pads 13 and the routing traces 311. The core layer 21 contacts and covers the metal carrier 11, the protruded metal platform 12, the auxiliary metal pads 13 and the routing traces 311 from below, and surrounds and conformally coats side walls of the protruded metal platform 12, the auxiliary metal pads 13 and the routing traces 311 in the lateral directions.

Figure 30:
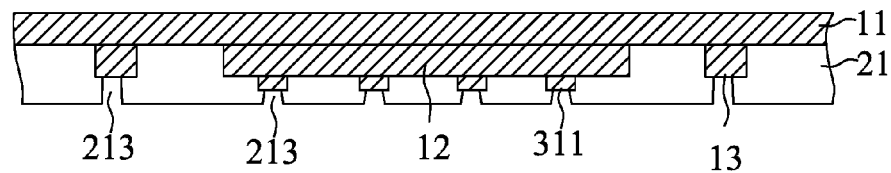
FIG. 30 is a cross-sectional view showing that the structure of FIG. 29 is provided with via openings in accordance with the third embodiment of the present invention.

FIG. 30 is a cross-sectional view of the structure provided with via openings 213 to expose selected portions of the auxiliary metal pads 13 and the routing traces 311 from below. The via openings 213 extend through the core layer 21 and aligned with selected portions of the auxiliary metal pads 13 and the routing traces 311.

Figure 31:
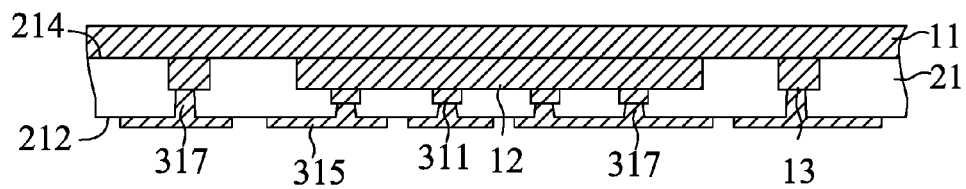
FIG. 31 is a cross-sectional view showing that the structure of FIG. 30 is provided with conductive traces in accordance with the third embodiment of the present invention.

FIG. 31 is a cross-sectional view of the structure with conductive traces 315 on the core layer 21 by metal deposition and metal patterning process. The conductive traces 315 extend from the auxiliary metal pads 13 and the routing traces 311 in the downward direction, fill up the via openings 213 to form first metallized vias 317 in direct contact with the auxiliary metal pads 13 and the routing traces 311, and extend laterally on the first surface 212 of the core layer 21.

Figure 32:
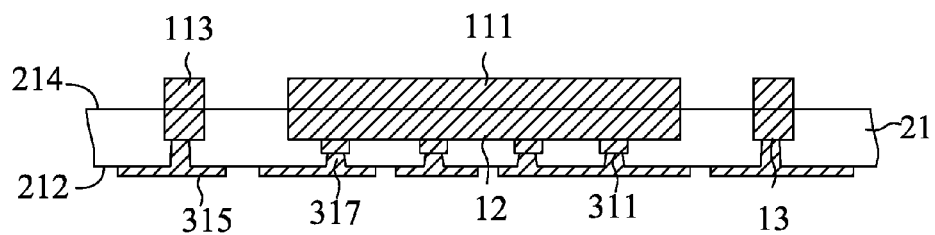
FIG. 32 is a cross-sectional view showing that the structure of FIG. 31 is formed with a metal slug and metal posts in accordance with the third embodiment of the present invention.

FIG. 32 is a cross-sectional view of the structure with a metal slug 111 and an array of metal posts 113 formed by removing selected portions of the metal carrier 11. The metal slug 111 is aligned with and covers the protruded metal platform 12 from above. The metal posts 113 are aligned with and electrically connected to the auxiliary metal pads 13.

Figure 33:
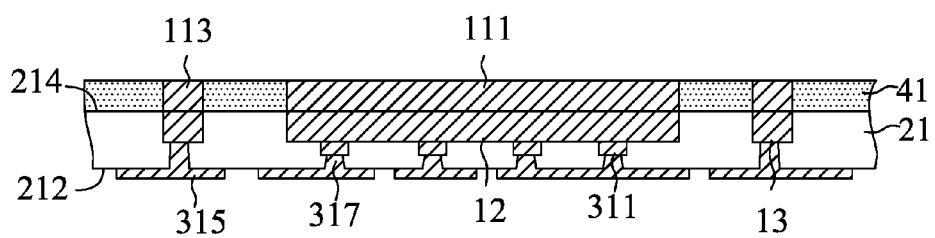
FIG. 33 is a cross-sectional view showing that the structure of FIG. 32 is provided with a stiffener in accordance with the third embodiment of the present invention.

FIG. 33 is a cross-sectional view of the structure with a stiffener 41 on the core layer 21. The stiffener 41 covers the exposed second surface 214 of the core layer 21 and surrounds and conformally coats and covers sidewalls of the metal slug 111 and the metal posts 113 in the lateral directions.

Figure 34:
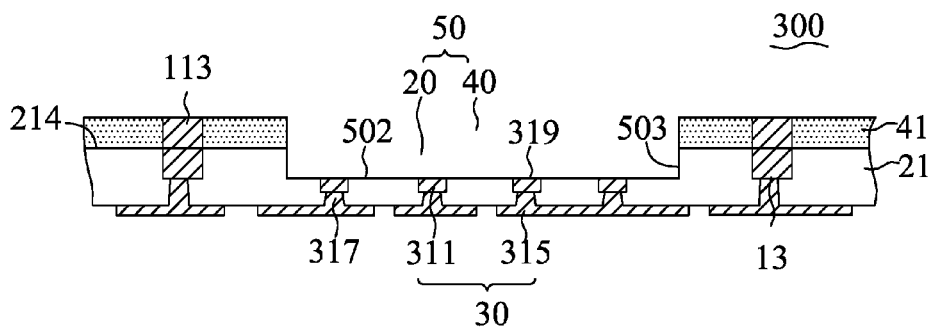
FIG. 34 is a cross-sectional view showing that the structure of FIG. 33 is provided with a cavity to finish the fabrication of an interconnect substrate in accordance with the third embodiment of the present invention.

FIG. 34 is a cross-sectional view of the structure after removal of the metal slug 111 and the protruded metal platform 12. As a result, a cavity 50 is formed and consists of a recess 20 in the core layer 21 and an aperture 40 in the stiffener 41.

Accordingly, as shown in FIG. 34, an interconnect substrate 300 is accomplished and includes an array of metal posts 113, an array of auxiliary metal pads 13, a core layer 21, a buildup circuitry 30, a stiffener 41 and a cavity 50. In this illustration, the buildup circuitry 30 includes routing traces 311 exposed from the cavity 50 to provide contact pads 319 for device connection and conductive traces 315 electrically connected to the auxiliary metal pads 13 and the routing traces 311.

Figure 35:
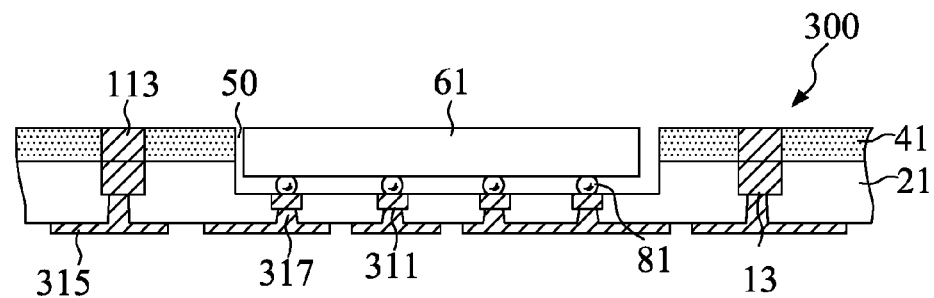
FIG. 35 is a cross-sectional view of a semiconductor assembly with a first semiconductor device electrically coupled to the interconnect substrate of FIG. 34 in accordance with the third embodiment of the present invention.

FIG. 35 is a cross-sectional view of a semiconductor assembly with a first semiconductor device 61 electrically coupled to the interconnect substrate 300 of FIG. 34. The first semiconductor device 61 is disposed in the cavity 50 of the interconnect substrate 300 and electrically coupled to the contact pads 319 of the buildup circuitry 30 via bumps 81.

Figure 36:
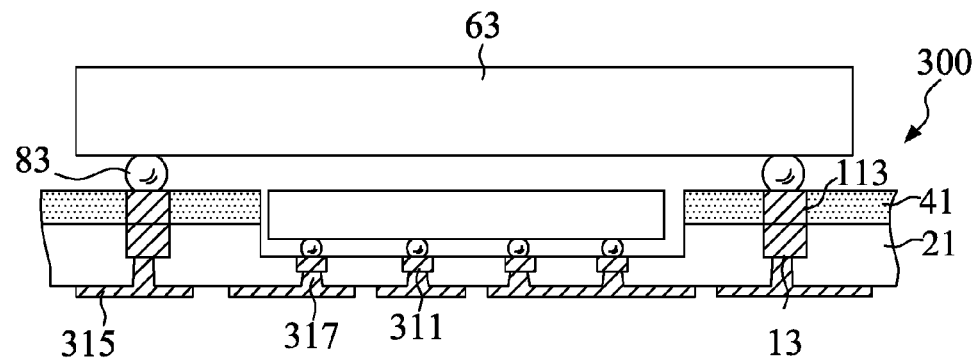
FIG. 36 is a cross-sectional view of a vertically stacked semiconductor assembly with a second semiconductor device electrically coupled to the semiconductor assembly of FIG. 35 in accordance with the third embodiment of the present invention.

FIG. 36 is a cross-sectional view of a vertically stacked semiconductor assembly with a second semiconductor device 63 mounted on the semiconductor assembly of FIG. 35. The second semiconductor device 63 is electrically coupled to the interconnect substrate 300 via solder balls 83 in contact with the metal posts 113.

Figure 37:
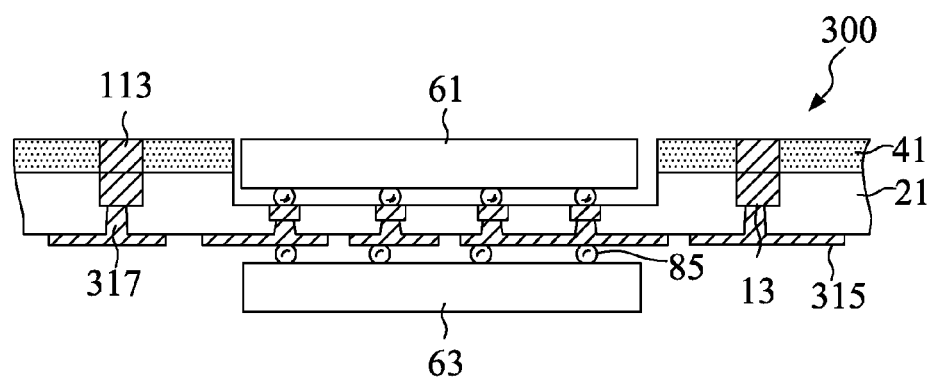
FIG. 37 is a cross-sectional view of another vertically stacked semiconductor assembly with a second semiconductor device electrically coupled to the semiconductor assembly of FIG. 35 in accordance with the third embodiment of the present invention.

FIG. 37 is a cross-sectional view of another vertically stacked semiconductor assembly with a second semiconductor device 63 mounted on the semiconductor assembly of FIG. 35. The second semiconductor device 63 is face-to-face electrically connected to the first semiconductor device 61 through the buildup circuitry 30 therebetween.

Embodiment 4

FIGS. 38-45 are schematic views showing a method of making an interconnect substrate with a multi-layered buildup circuitry in accordance with the fourth embodiment of the present invention.

For purposes of brevity, any description in aforementioned Embodiments above is incorporated herein insofar as the same is applicable, and the same description need not be repeated.

Figure 38:
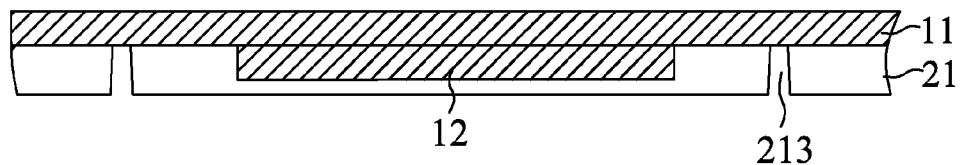
FIG. 38 is a cross-sectional view showing that the structure of FIG. 1 is provided with a core layer and via openings in the core layer in accordance with the fourth embodiment of the present invention.

FIG. 38 is a cross-sectional view of the structure with a core layer 21 on the metal carrier 11 and the protruded metal platform 12 of FIG. 1 and via opening 213 in the core layer 21. The core layer 21 contacts and covers the metal carrier 11 and the protruded metal platform 12 from below, and surrounds and conformally coats side walls of the protruded metal platform 12 in the lateral directions. The via openings 213 extend through the core layer 21 and aligned with selected portions of the metal carrier 11.

Figure 39:
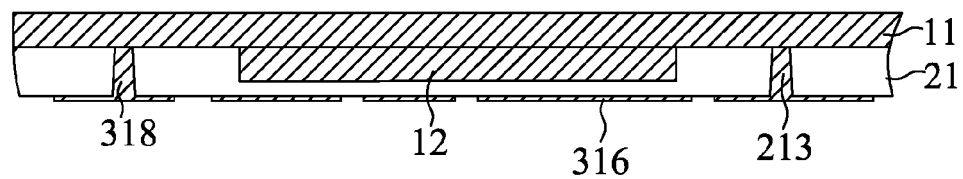
FIG. 39 is a cross-sectional view showing that the structure of FIG. 38 is provided with first conductive traces in accordance with the fourth embodiment of the present invention.

FIG. 39 is a cross-sectional view of the structure with first conductive traces 316 on the core layer 21 by metal deposition and metal patterning process. The conductive traces 316 extend from the metal carrier 11 in the downward direction, fill up the via openings 213 to form first metallized vias 318 in direct contact with the metal carrier 11, and extend laterally on the core layer 21.

Figure 40:
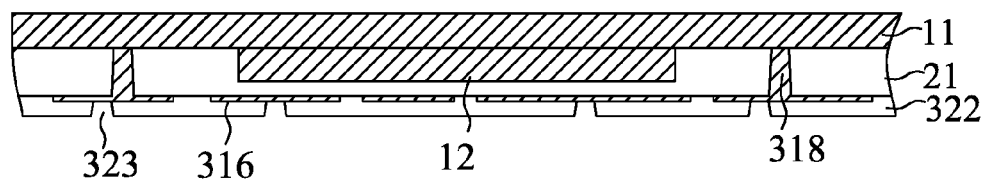
FIG. 40 is a cross-sectional view showing that the structure of FIG. 39 is provided with a dielectric layer and via openings in the dielectric layer in accordance with the fourth embodiment of the present invention.

FIG. 40 is a cross-sectional view of the structure with a dielectric layer 322 on the core layer 21 as well as the first conductive traces 316 and via openings 323 in the dielectric layer 322. The dielectric layer 322 is deposited typically by lamination or coating, and contacts and covers and extends laterally on the core layer 21 and the first conductive traces 316 from below. The dielectric layer 322 typically has a thickness of 50 microns, and can be made of epoxy resin, glass-epoxy, polyimide, or the like. After the deposition of the dielectric layer 322, the via openings 323 are formed and extend through the dielectric layer 322 to expose selected portions of the first conductive traces 316.

Figure 41:
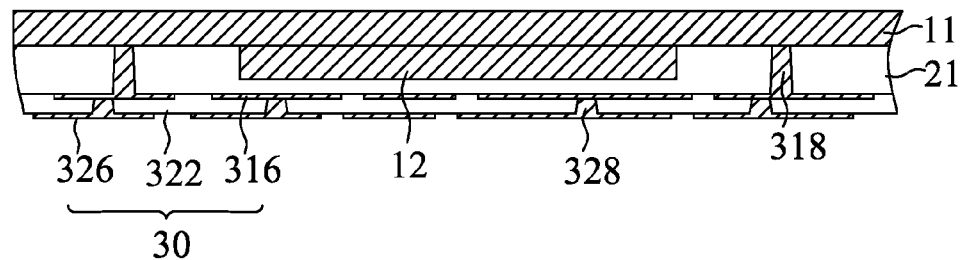
FIG. 41 is a cross-sectional view showing that the structure of FIG. 40 is provided with second conductive traces in accordance with the fourth embodiment of the present invention.

FIG. 41 is a cross-sectional view of the structure provided with second conductive traces 326 on the dielectric layer 322 by metal deposition and metal patterning process. The second conductive traces 326 extend from the first conductive traces 316 in the downward direction, fill up the via openings 323 to form second metallized vias 328 in direct contact with the first conductive traces 316, and extend laterally on the dielectric layer 322.

At this stage, a multi-layered buildup circuitry 30 is accomplished and includes first conductive traces 316, a dielectric layer 322 and second conductive traces 326.

Figure 42:
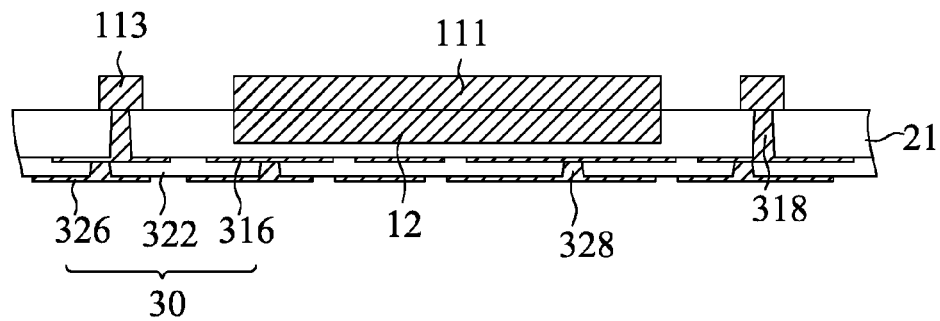
FIG. 42 is a cross-sectional view showing that the structure of FIG. 41 is formed with a metal slug and metal posts in accordance with the fourth embodiment of the present invention.

FIG. 42 is a cross-sectional view of the structure with a metal slug 111 and an array of metal posts 113 formed by removing selected portions of the metal carrier 11. The metal slug 111 is aligned with and covers the protruded metal platform 12 from above. The metal posts 113 are electrically connected to the buildup circuitry 30 via the first metallized vias 318.

Figure 43:
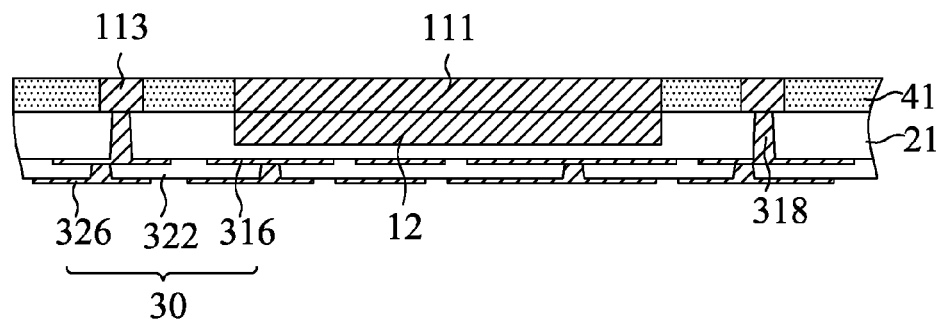
FIG. 43 is a cross-sectional view showing that the structure of FIG. 42 is provided with a stiffener in accordance with the fourth embodiment of the present invention.

FIG. 43 is a cross-sectional view of the structure with a stiffener 41 on the core layer 21. The stiffener 41 covers the core layer 21 from above and surrounds and conformally coats and covers sidewalls of the metal slug 111 and the metal posts 113 in the lateral directions.

Figure 44:
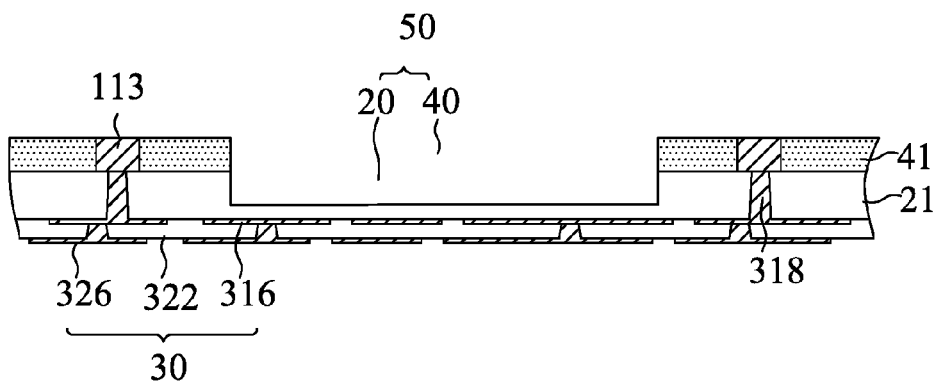
FIG. 44 is a cross-sectional view showing that the structure of FIG. 43 is provided with a cavity in accordance with the fourth embodiment of the present invention.

FIG. 44 is a cross-sectional view of the structure after removal of the metal slug 111 and the protruded metal platform 12. As a result, a cavity 50 is formed and consists of a recess 20 in the core layer 21 and an aperture 40 in the stiffener 41.

Figure 45:
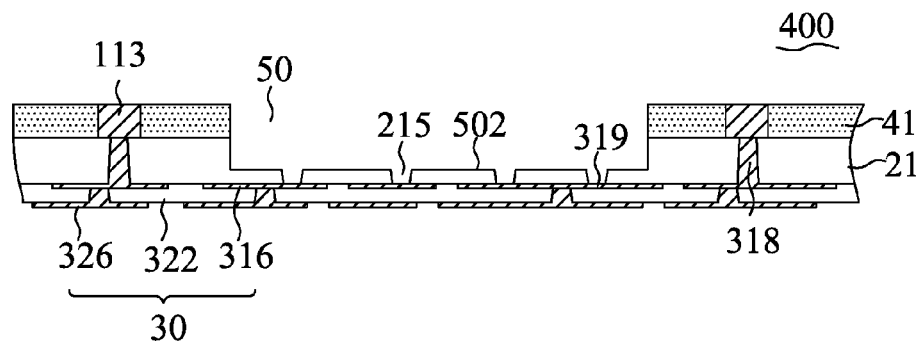
FIG. 45 is a cross-sectional view showing that the structure of FIG. 44 is provided with via openings to finish the fabrication of an interconnect substrate in accordance with the fourth embodiment of the present invention.

FIG. 45 is a cross-sectional view of the structure provided with via openings 215 to expose selected portions of the first conductive traces 316 from the cavity 50. The via openings 215 are aligned with selected portions of the first conductive traces 316 and extend from the bottom surface 502 of the cavity 50 and into the core layer 21. As a result, the exposed portions of the first conductive traces 316 can serve as contact pads 319 for device connection.

Accordingly, as shown in FIG. 45, an interconnect substrate 400 is accomplished and includes metal posts 113, a core layer 21, a buildup circuitry 30, a stiffener 41 and a cavity 50. In this illustration, the buildup circuitry 30 is a multi-layer structure and includes first conductive traces 316, a dielectric layer 322 and second conductive traces 326.

Figure 46:
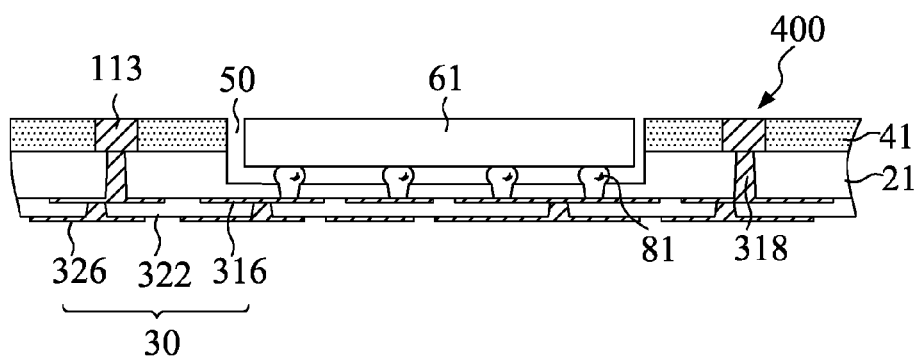
FIG. 46 is a cross-sectional view of a semiconductor assembly with a first semiconductor device electrically coupled to the interconnect substrate of FIG. 45 in accordance with the fourth embodiment of the present invention.

FIG. 46 is a cross-sectional view of a semiconductor assembly with a first semiconductor device 61 electrically coupled to the interconnect substrate 400 of FIG. 45. The first semiconductor device 61 is disposed in the cavity 50 of the interconnect substrate 400 and electrically coupled to the contact pads 319 of the buildup circuitry 30 via bumps 81.

Figure 47:
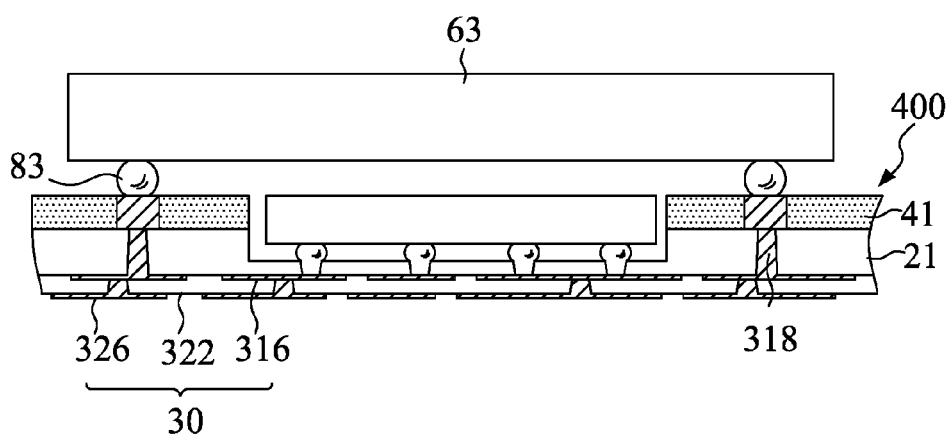
FIG. 47 is a cross-sectional view of a vertically stacked semiconductor assembly with a second semiconductor device electrically coupled to the semiconductor assembly of FIG. 46 in accordance with the fourth embodiment of the present invention.

FIG. 47 is a cross-sectional view of a vertically stacked semiconductor assembly with a second semiconductor device 63 mounted on the semiconductor assembly of FIG. 46. The second semiconductor device 63 is electrically coupled to the interconnect substrate 400 via solder balls 83 in contact with the metal posts 113.

Figure 48:
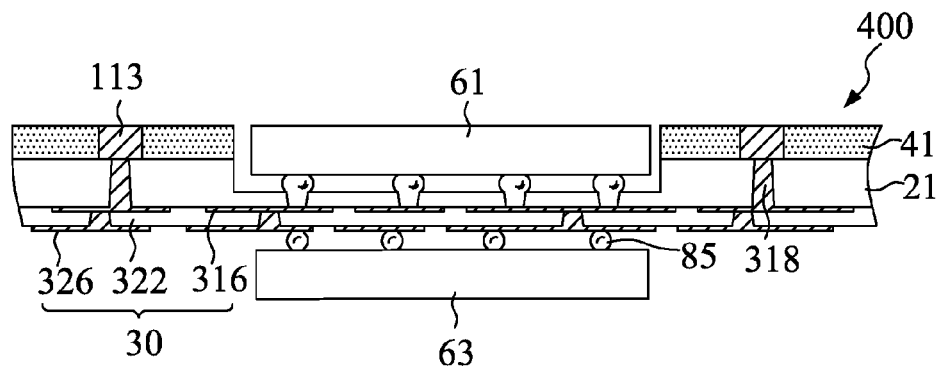
FIG. 48 is a cross-sectional view of another vertically stacked semiconductor assembly with a second semiconductor device electrically coupled to the semiconductor assembly of FIG. 46 in accordance with the fourth embodiment of the present invention.

FIG. 48 is a cross-sectional view of another vertically stacked semiconductor assembly with a second semiconductor device 63 mounted on the semiconductor assembly of FIG. 46. The second semiconductor device 63 is face-to-face electrically connected to the first semiconductor device 61 through the buildup circuitry 30 therebetween.

Embodiment 5

Figure 49:
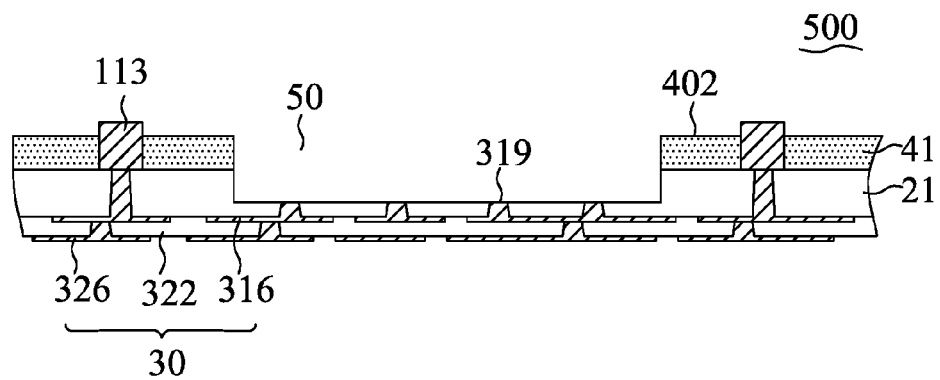
FIG. 49 is a cross-sectional view of another interconnect substrate with the metal posts projecting from the stiffener in accordance with the fifth embodiment of the present invention.

FIG. 49 is a cross-sectional view of another interconnect substrate in accordance with the fifth embodiment of the present invention.

In this embodiment, the interconnect substrate 500 is similar to that illustrated in Embodiment 1, except that (i) the buildup circuitry 30 is a multi-layer structure and (ii) the metal posts 113 extend beyond the exterior surface 402 of the stiffener 41 and have a selected portion uncovered by the stiffener 41 and projecting from the exterior surface 402 of the stiffener 41.

Embodiment 6

Figure 50:
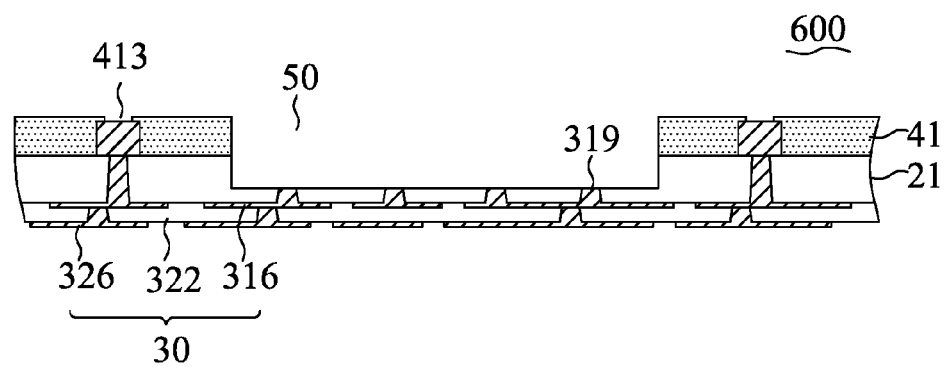
FIG. 50 is a cross-sectional view of yet another interconnect substrate having openings formed in the stiffener to expose the metal posts in accordance with the sixth embodiment of the present invention.

FIG. 50 is a cross-sectional view of interconnect substrate in accordance with the sixth embodiment of the present invention.

In this embodiment, the interconnect substrate 600 is similar to that illustrated in Embodiment 1, except that (i) the buildup circuitry 30 is a multi-layer structure and (ii) the stiffener 41 has a larger thickness than that of the metal posts 113 and includes openings 413 to expose selected portions of the metal posts 113.

The interconnect substrates and semiconductor assemblies described above are merely exemplary. Numerous other embodiments are contemplated. In addition, the embodiments described above can be mixed-and-matched with one another and with other embodiments depending on design and reliability considerations. For instance, the interconnect substrate may include multiple cavities arranged in an array and each cavity can accommodate a semiconductor device therein. Also, the buildup circuitry can include additional contact pads exposed from additional cavities for electrical connection with additional semiconductor devices.

As illustrated in the aforementioned embodiments, a distinctive interconnect substrate is configured and includes a core layer, a buildup circuitry, a stiffener, an array of metal posts, a cavity and optionally an array of auxiliary metal pads. By the method of the present invention, the stiffener/metal posts and the buildup circuitry are formed over both opposite sides of the core layer without adhesive between the stiffener and the buildup circuitry. For the convenience of following description, the direction in which the first surface of the core layer faces is defined as the first direction, and the direction in which the opposite second surface of the core layer faces is defined as the second direction. The buildup circuitry over the first surface of the core layer has an exterior surface facing in the first direction, whereas the stiffener over the second surface of the core layer has an exterior surface facing in the second direction.

The metal posts can provide vertical electrical connections around the cavity. In a preferred embodiment, the metal posts are formed by removing a selected portion of a metal carrier with a protruded metal platform and optional auxiliary metal pads thereon after the core layer is provided to contact and cover the metal carrier and the protruded metal platform in the first direction. As a result, the metal posts can be disposed over the second surface of the core layer and contact the optional auxiliary metal pads or metalized vias in the core layer.

The stiffener covers sidewalls of the metal posts and has a thickness different from or the same as the height of the metal posts. For instance, the exterior surface of the stiffener may be substantially coplanar with the exposed surface of the metal posts in the second direction. Alternatively, the thickness of the stiffener may be larger than or smaller than the height of the metal posts. In the aspect of the stiffener having larger thickness, the stiffener includes openings formed therein and extending from the exterior surface of the stiffener to the metal posts so as to expose a selected portion of the metal posts in the second direction. As for the alternative aspect of the stiffener having smaller thickness, the metal posts extend beyond the exterior surface of the stiffener in the second direction and have an exposed portion projecting from the exterior surface of the stiffener and uncovered by the stiffener. In any case, the metal posts are exposed from the exterior surface of the stiffener to provide electrical contacts for next level connection. Preferably, the stiffener is made of any material which has enough mechanical robustness, and laterally extends to peripheral edges of the interconnect substrate. As a result, the stiffener can provide mechanical support for the interconnect substrate to suppress warping and bending.

The cavity preferably has a depth larger than the height of the metal posts and is laterally surrounded by the stiffener and the core layer. More specifically, in the cavity-up position, the bottom surface of the cavity is lower than the bottom side of the metal posts. The cavity can be formed by removing the protruded metal platform and a corresponding portion of the metal carrier. As a result, the cavity includes an aperture in the stiffener and a recess in the core layer. In a preferred embodiment, the depth of the recess is less than the thickness of the core layer, whereas the depth of the aperture is equal to the thickness of the stiffener. The aperture and the recess can have the same diameter, and sidewalls of the aperture may be flush with those of the recess. However, in some cases, the diameter of the aperture is different from that of the recess. For instance, the diameter of the aperture may be larger than that of the recess, and the aperture laterally extends beyond peripheral edges of the recess.

The optional auxiliary metal pads and the protruded metal platform can be simultaneously deposited on the metal carrier before provision of the core layer and may be made of copper, aluminum, nickel or other metals or alloy. As the auxiliary metal pads and the protruded metal platform can have the same thickness, the depth of the recess formed by removing the protruded metal platform typically is substantially equal to the thickness of the auxiliary metal pads. Additionally, the metal post and the auxiliary metal pad can have the same or different diameters where they contact each other.

The buildup circuitry includes selected portions exposed from the cavity and metallized vias electrically connected to the metal posts. Accordingly, the buildup circuitry can provide electrical connections between the metal posts and a semiconductor device disposed within the cavity, and the electrical connection between the metal posts and the buildup circuitry can be devoid of soldering material. In a preferred embodiment, the buildup circuitry includes conductive traces that directly contact and extend from the metal posts or the auxiliary metal pads, and fill up via openings in the core layer to form metallized vias, and laterally extend on the first surface of the core layer, and has selected portions exposed from the cavity to provide contact pads for device connection. As an alternative, the buildup circuitry may further include routing traces that are deposited on the protruded metal platform before provision of the core layer and electrically connected to the conductive traces and exposed from the cavity by removing the protruded metal platform. Accordingly, the routing traces exposed from the cavity can provide contact pads for device connection.

The buildup circuitry can further include one or more dielectric layers, additional via openings in the dielectric layer, and additional conductive traces if needed for further signal routing. The dielectric layer and the conductive traces are serially formed in an alternate fashion and can be in repetition when needed. The outmost conductive traces of the buildup circuitry can respectively accommodate conductive joints, such as solder balls, for electrical communication and mechanical attachment with another electronic device.

The present invention also provides a semiconductor assembly in which a first semiconductor device is disposed in the cavity of the interconnect substrate and electrically coupled to the interconnect substrate through the contact pads exposed from the cavity. More specifically, the first semiconductor device can be flip mounted on the contact pads using a wide variety of connection media such as bumps on the contact pads. The first semiconductor device can be a packaged or unpackaged chip. For instance, the first semiconductor device can be a bare chip, or a wafer level packaged die, etc. Alternatively, the first semiconductor device can be a stacked-die chip. Optionally, a resin encapsulation element can be further provided to cover and extend from the bottom surface of the cavity and fill at least one portion of spaces unoccupied by the first semiconductor device in the cavity. Additionally, a second semiconductor device may be further provided and electrically coupled to the interconnect substrate using conductive joints on the metal posts or the outmost conductive traces of the buildup circuitry. Accordingly, the present invention can provide a package-on-package assembly that includes a first semiconductor device positioned in the cavity of the interconnect substrate and a second semiconductor device positioned over the exterior surface of the stiffener as well as an inactive surface the first semiconductor device. Also, the present invention provides a face-to-face assembly that includes a first semiconductor device positioned in the cavity of the interconnect substrate and a second semiconductor device face-to-face electrically connected to the first semiconductor device through the buildup circuitry therebetween.

The term "cover" refers to incomplete or complete coverage in a vertical and/or lateral direction. For instance, in the cavity-up position, the buildup circuitry covers the first semiconductor device in the downward direction regardless of whether another element such as bumps are between the buildup circuitry and the first semiconductor device. Likewise, the core layer can cover the cavity in the first direction.

The phrase "corresponding portion of the metal carrier" refers to a selected portion of the metal carrier that covers the protruded metal platform in the second direction. For instance, in the position that the first surface of the core layer faces in the downward direction, the corresponding portion of the metal carrier completely covers the protruded metal platform in the upward direction regardless of whether the corresponding portion of the metal carrier laterally extends beyond peripheral edges of the protruded metal platform or laterally extends to be flush with peripheral edges of the protruded metal platform.

The phrase "aligned with" refers to relative position between elements regardless of whether elements are spaced from or adjacent to one another or one element is inserted into and extends into the other element. For instance, the metal slug are aligned with the protruded metal platform since an imaginary vertical line intersects the metal slug and the protruded metal platform, regardless of whether another element is between the metal slug and the protruded metal platform and is intersected by the line, and regardless of whether another imaginary vertical line intersects the metal slug but not the protruded metal platform or intersects protruded metal platform but not the metal slug. Likewise, the via openings are aligned with the metal posts or the auxiliary metal pads.

The phrases "electrical connection", "electrically connected" and "electrically coupled" refer to direct and indirect electrical connection. For instance, the first conductive traces directly contact and are electrically connected to the metal posts or the auxiliary metal pads, and the second conductive traces are spaced from and electrically connected to the metal posts or the auxiliary metal pads by the first conductive traces.

The "first direction" and "second direction" do not depend on the orientation of the interconnect substrate or the semiconductor assembly, as will be readily apparent to those skilled in the art. For instance, the first surface of the core layer faces the first direction and the second surface of the core layer faces the second direction regardless of whether the interconnect substrate or the semiconductor assembly is inverted. Thus, the first and second directions are opposite one another and orthogonal to the lateral directions. Furthermore, the first direction is the downward direction and the second direction is the upward direction in the cavity-up position, and the first direction is the upward direction and the second direction is the downward direction in the cavity-down position.

The interconnect substrate according to the present invention has numerous advantages. For instance, the minimal height of the metal posts can be reduced by the amount equal to the depth of the recess such that a higher number of metal posts can be disposed. The buildup circuitry can provide signal routing with simple circuitry patterns or flexible multi-layer signal routing with complex circuitry patterns. As the semiconductor device can be attached to the buildup circuitry of the interconnect substrate by bumps, not by direct build-up process, the simplified process steps result in lower manufacturing cost. The interconnect substrate made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A method of making an interconnect substrate having cavity for stackable semiconductor assembly, comprising:
   forming a protruded metal platform on a surface of a metal carrier;
   forming a core layer covering the protruded metal platform and the remaining surface of the metal carrier, wherein the core layer has a first surface facing away from the metal carrier and an opposite second surface adjacent to the metal carrier;
   forming an array of metal posts and a metal slug by removing a portion of the metal carrier, wherein the metal slug is aligned with the protruded metal platform;
   forming a buildup circuitry from the first surface of the core layer, the buildup circuitry having an exterior surface facing away from the first surface of the core layer;
   forming a stiffener that covers the second surface of the core layer and sidewalls of the metal slug and the metal posts, the stiffener having an exterior surface facing away from the second surface of the core layer; and
   forming a cavity by removing the metal slug and the protruded metal platform, the cavity including an aperture in the stiffener and a recess in the core layer and having a bottom surface and sidewalls that extend from the bottom surface to the exterior surface of the stiffener;
   wherein an array of contact pads of the buildup circuitry are exposed from the bottom surface of the cavity, and the metal posts are exposed from the exterior surface of the stiffener and electrically connected to the buildup circuitry through metallized vias in the core layer.

2. The method of claim 1, further comprising a step of forming an array of auxiliary metal pads on the surface of the metal carrier before the step of forming the core layer, wherein the core layer also covers the auxiliary metal pads, and the metal posts are formed on the auxiliary metal pads.

3. The method of claim 2, wherein the auxiliary metal pads have a thickness substantially equal to that of the protruded metal platform.

* * * * *